(12) United States Patent
Mack et al.

(10) Patent No.: US 9,023,682 B2
(45) Date of Patent: May 5, 2015

(54) METHOD FOR PRODUCING A PHOTOVOLTAIC SOLAR CELL

(75) Inventors: Sebastian Mack, Freiburg (DE); Ulrich Jager, Freiburg (DE); Andreas Wolf, Freiburg (DE); Daniel Biro, Freiburg (DE); Ralf Preu, Freiburg (DE); Gero Kastner, Freiburg (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 13/704,683

(22) PCT Filed: Jun. 16, 2011

(86) PCT No.: PCT/EP2011/002968
§ 371 (c)(1),
(2), (4) Date: Dec. 17, 2012

(87) PCT Pub. No.: WO2011/157422
PCT Pub. Date: Dec. 22, 2011

(65) Prior Publication Data
US 2013/0095595 A1 Apr. 18, 2013

(30) Foreign Application Priority Data

Jun. 18, 2010 (DE) .......................... 10 2010 024 309

(51) Int. Cl.
*H01L 21/00* (2006.01)
*H01L 31/18* (2006.01)
(Continued)

(52) U.S. Cl.
CPC ........ *H01L 31/1864* (2013.01); *H01L 21/2255* (2013.01); *H01L 21/268* (2013.01); *H01L 31/022425* (2013.01); *H01L 31/068* (2013.01); *Y02E 10/547* (2013.01)

(58) Field of Classification Search
CPC ........... H01L 2/00; H01L 31/00; H01L 25/00; H01L 31/1864; H01L 21/268
USPC ................ 438/69, 71, 98, 115; 257/E27.124, 257/E25.007, E25.009
See application file for complete search history.

(56) References Cited

U.S. PATENT DOCUMENTS 5,840,604 A * 11/1998 Yoo et al. ...................... 438/230
7,615,393 B1    11/2009 Shah et al.
(Continued)

OTHER PUBLICATIONS

Kohler, J.R. et al., "Laser Doped Selective Emitters Yield 0.5% Efficiency Gain,", 24th European Photovoltaic Solar Energy Conference, Sep. 21, 2009, pp. 1847-1850.
(Continued)

*Primary Examiner* — Jarrett Stark
*Assistant Examiner* — Shahed Ahmed
(74) *Attorney, Agent, or Firm* — Volpe and Koenig, P.C.

(57) ABSTRACT

A method for producing a photovoltaic solar cell, including the following steps: A. texturizing a front (2) of a semiconductor substrate; B. generating a selective emitter doping on the front (2) of the semiconductor substrate by generating on the front (2) a first low-doped region (4) and a local high-doped region (3) within the first low-doped region; and C. applying at least one metal emitter contact structure to the front (2) of the semiconductor substrate, at least in the regions of local high doping, wherein, between method steps B and C, a respective silicon oxide layer (5a, 5b) is generated in a method step B1 simultaneously on the front and back of the semiconductor substrate via thermal oxidation.

17 Claims, 2 Drawing Sheets

(51) Int. Cl.
*H01L 21/225* (2006.01)
*H01L 21/268* (2006.01)
*H01L 31/0224* (2006.01)
*H01L 31/068* (2012.01)

(56) References Cited

U.S. PATENT DOCUMENTS

2002/0153039 A1* 10/2002 Moon et al. .................. 136/256
2009/0020158 A1    1/2009 Ohtsuka et al.
2010/0288350 A1* 11/2010 Lee et al. .................... 136/256
2011/0089393 A1*  4/2011 Chang et al. ..................... 257/4
2011/0240997 A1* 10/2011 Rockenberger et al. ........ 257/49
2013/0167915 A1*  7/2013 Moslehi et al. ............... 136/255

OTHER PUBLICATIONS

Jaeger, U. et al., "Selective Emitter by Laser Doping from Phosphosilicate Glass," European Photovoltaic Solar Energy Conference and Exhibition, Sep. 21-25, 2009, Hamburg Germany, pp. 1740-17843.

Schindler R. et al., "Single Step Rapid Thermal Diffusion for Selective Emitter Formation and Selective Oxidation," May 13, 1996, pp. 509-512.

* cited by examiner

Figure 1 (a-b)
a)
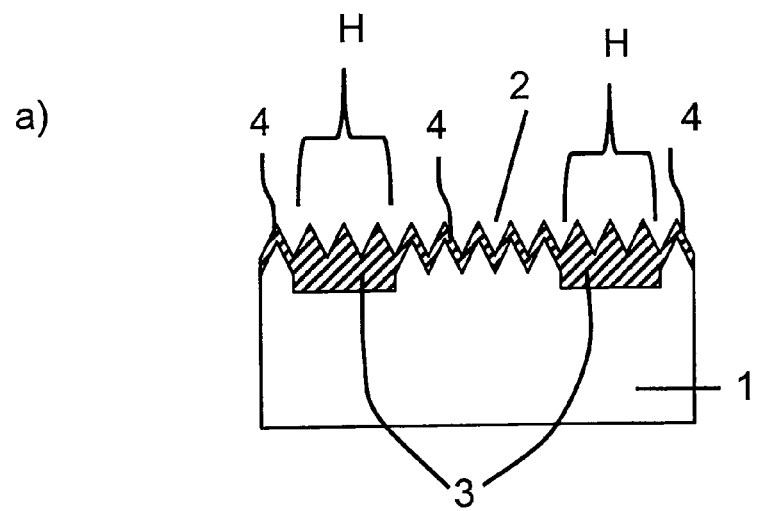
b)
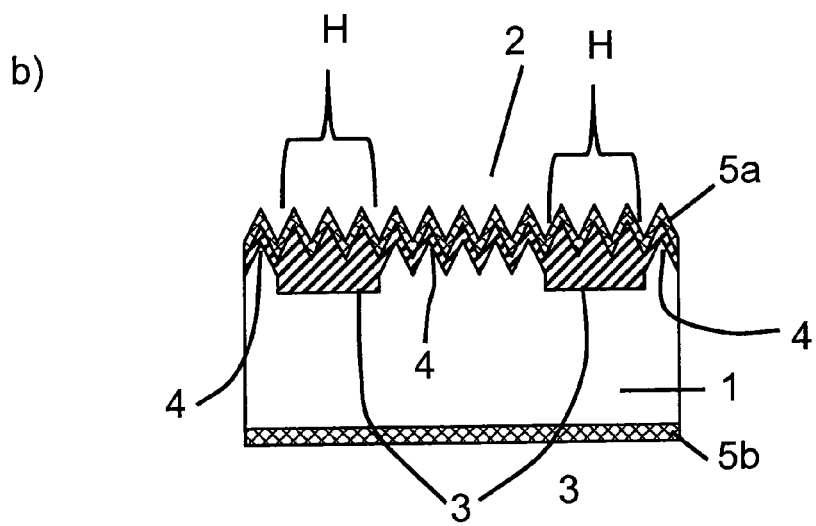

Figure 1 (c-d)
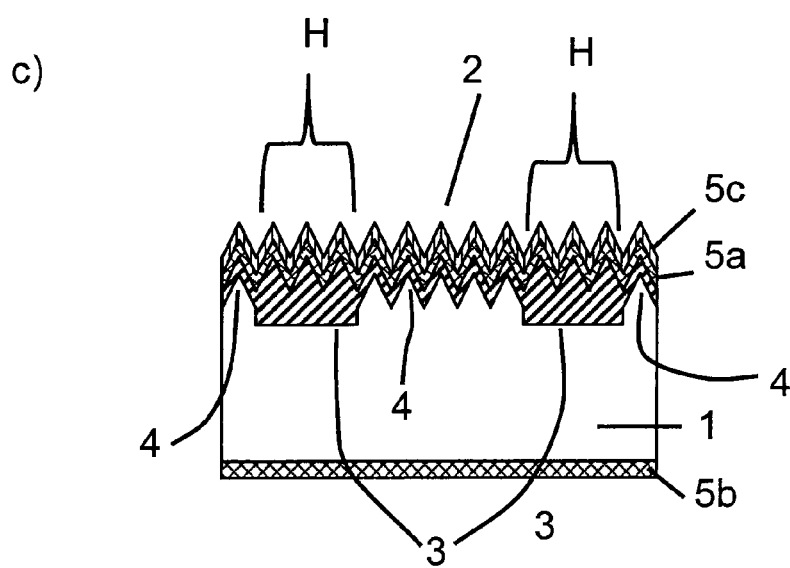
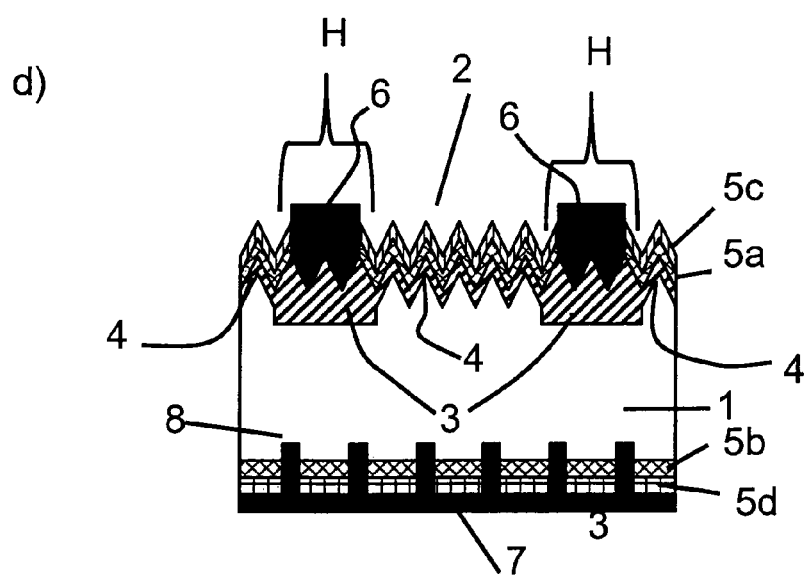

METHOD FOR PRODUCING A PHOTOVOLTAIC SOLAR CELL

BACKGROUND

The invention relates to a method for producing a photovoltaic solar cell.

A photovoltaic solar cell represents a planar semiconductor element, in which via incident electromagnetic radiation a generation of electron-hole pairs is yielded, and a separation of charge carrier occurs at least at one pn-transfer so that an electric potential difference develops between at least two electric contacts of the solar cell and via an external circuit connected to these contacts electric power can be tapped from the solar cell.

Typical solar cells comprise a silicon semiconductor substrate of a base doping, with at least one emitter section of an emitter doping being embodied in said semiconductor substrate, which is opposite in reference to the base doping, so that the above-mentioned pn-transfer forms between the base section and the emitter section. The base section and the emitter section are each contacted by at least one metallic contact structure to collect and conduct the charge carriers.

In order to yield high effectiveness here an optimization must occur with regards to several loss mechanisms:

A band structure is given inside a crystalline semiconductor, such as silicon. It is disturbed at the surface of the semiconductor, because here e.g., photo-generated charge carriers can be combined more easily. This loss mechanism particularly reduces the no-load voltage, but also the short-circuit current density of solar cells, thus lowering their effectiveness. By applying a dielectric layer at sections of a solar cell, which cannot be contacted later on, such recombination loss can be reduced. This is called an improved passivation of the surface. The improved passivation may be obtained in various fashions:

On the one hand, by positive or negative charges appearing at the surface, due to the Coulomb repulsion of charged particles, a type of charge carriers, thus negatively charged electrons or positively charged defect electrons, also called holes, may be eliminated from the surface. Due to the fact that the recombination depends on the product of the densities of charge carriers here, by a suitable selection of charge carriers, i.e. positive or negative charges, and the amount of applied charge carriers the recombination rate can be reduced. On the one hand, the recombination of the surface defects occurs similar to open bonds. Any reduction of this so-called interface density by chemical bonding with an applied dielectric layer is important to allow higher effectiveness.

In general, any passivation is based on a combination of these two effects. Another possibility to reduce the loss by recombination at the surface of a semiconductor is to introduce a band bending in the semiconductor by introducing a doping atom by way of diffusion. For this purpose, generally atoms are used from the third or fifth main groups. In case of silicon being the semiconductor material, primarily phosphorus, boron, and aluminum are used, here. They act similar to applied charges and shield the surface from one type of charge carriers.

At the front of a semiconductor disk, such as a silicon wafer, presently in most wafer-based solar cell—production lines, a dielectric layer is applied, e.g., silicon nitride. This may be achieved e.g., by plasma-enhanced chemical vapor deposition (PECVD) or by cathode evaporation. Here, the dielectric layer serves for passivation of the surface, however it also forms an optically particular beneficial adjustment to the solar spectrum in order to reduce reflection loss by the various diffraction indices of silicon and the ambient material, e.g., air or polymer-based encapsulating films or modular glass.

Presently, no dielectric layers are used at the back of silicon solar cells in the industrial production because contacting generally occurs over the entire surface using printed and/or e.g., dried pastes and a subsequent tempering step to form contacts. Any dielectric passivation with an only locally contacted back allows a considerable increase of effectiveness of the solar cell, however it is technologically more expensive and thus, due to the higher costs, it is not used in present industrial production.

Furthermore, in order to yield high effectiveness optimization is required with regards to the following loss mechanisms:

For example, high doping is advantageous in order to form a low electric contact resistance between metal layers and contacted semiconductor sections. On the other hand, higher doping generally leads to a higher recombination of electron hole—pairs within the semiconductor substrate.

Accordingly, both in the emitter section as well as in the base section it is known to form selective doping structures.

For example, the embodiment of selective emitter structures is known, in which here on the front of the semiconductor substrate, facing the light, an emitter is embodied in a planar fashion with a first doping profile, and only in the sections in which contacting the emitter shall be embodied by a metallic emitter—contract structure applied on the front of the semiconductor structure, a second emitter profile is embodied with a lateral conductivity and surface doping which is higher in reference to the first profile. Such a selective emitter ensures that in a lateral conduction of charge carriers a reduction of recombination is yielded within the emitter section of the first emitter profile and on the other side, due to the higher doping, particularly the higher surface concentration of the second doping profile, a lower contact resistance is yielded in reference to the metallic contact structure.

Ultimately, here at the surfaces of a semiconductor substrate for the production of a solar cell typically both p-doped and n-doped sections are provided as well as the high-doped and low-doped sections of the respective doping type, i.e. sections with high and in reference thereto low concentration of surface doping.

SUMMARY

The present invention is therefore based on the objective to provide a method for the production of a photovoltaic solar cell in which an increase of effectiveness is achieved such that for the production of a solar cell the front and the back of a semiconductor substrate must be passivised at least sectionally with regards to the surface recombination speed and the passivation is effective at the surface both on sections with p-doping as well as n-doping. Furthermore, the method according to the invention shall be implemented in a cost-effective industrial fashion, particularly in comparison to methods of prior art for the sectional passivation of the surface of a semiconductor substrate.

This objective is attained in a method for the production of a photovoltaic solar cell according to the invention. Preferred embodiments of the method according to the invention are discernible from the disclosure and claims.

The method according to the invention comprises the following processing steps:

In a processing step A the texturing of the front of a silicon semiconductor substrate occurs, which is doped with a base doping type. The texturing causes an enhanced light collection of the surface. For example, alkaline or acidic etching solutions or plasma-based processes may be used for texturing the surface.

In a processing step B the generation of at least one selective doping structure occurs at the front of the semiconductor substrate, with at the front at least one planar low-doped section being generated with a first doping profile in the semiconductor substrate and furthermore, within the first low-doping section, at least one local high-doped section is generated of a second doping profile. The low-doped section and the high-doped section are each embodied with a doping of an emitter doping type, with the emitter doping type being opposite the base doping type. The doping types are here the n-doping and the p-doping opposite thereto.

In the processing step B the high doped section is embodied with a lower lateral conductive resistance than the low doping section.

In a processing step C at least one metallic emitter contact structure is applied on the front of the semiconductor substrate, if applicable on additional intermediate layers. The application occurs at least partially at the sections of local high doping, with the emitter contact structure being connected to the high doped section in an electrically conductive fashion. Furthermore, in the processing step C at least one metallic base contact structure is applied on the back of the semiconductor substrate, if applicable on additional intermediate layers, with the base contact structure being connected in an electrically conductive fashion to a section of the semiconductor substrate with a doping of the base doping type.

The above-stated processing steps of prior art are known per se for the production of a photovoltaic solar cell with a selective doping structure and a textured front.

It is essential that in the method according to the invention, between the processing steps B and C, perhaps with additional intermediate steps being interposed, one silicon oxide layer each is generated simultaneously on the front and the back of the semiconductor substrate via thermal oxidation in a single processing step B1. The front silicon oxide layer generated on the front is here produced with a thickness of less than 150 nm.

The underlying objective is here attained in the method according to the invention by using a thermally grown oxide layer applied on both sides, on the front and the back, in the processing step B1.

Due to the fact that the thermal oxide "grows into" the semiconductor, i.e. a silicon layer with a low thickness is converted both at the front and the back of the semiconductor substrate into an oxide layer and thus the boundary between the semiconductor and the thermal oxide moves, here, the thermal oxide is characterized in an extremely low thickness at the interface to the semiconductor substrate (typically less than $10^{11}$ cm$^{-2}$ eV$^{-1}$) and accordingly a low charge density is given (typically below $10^{12}$ cm$^{-2}$). Therefore both p-doped as well as n-doped sections can be passivized with regards to the surface recombination speed.

Furthermore, contrary to the common unilateral coating processes, here the thermal oxide of all surfaces of a semiconductor substrate grows into the semiconductor material due to the generation from a gaseous atmosphere. This way, the simultaneous passivation is attained of the front and the back of the semiconductor substrate.

Furthermore, in the processing step B1 of the method according to the invention at least the frontal silicon oxide layer is generated with a thickness of less than 150 nm. This ensures that on the one hand, due to the silicon oxide layer, an electric passivation is yielded and thus a low surface recombination speed at the front, particularly both in the high-doped as well as the low-doped sections of the selective emitter structure.

Using the method according to the invention, here a textured photovoltaic solar cell can be produced in a cost-effective fashion at the front, which is passivized easily without the use of masking steps at the front and back, regardless of the doping of the sections abutting these surfaces and additionally the common embodiment, advantageous with regards to the light coupling at the front, is possible for example via a silicon nitride layer or aluminum oxide layer applied on the front for the use of the solar cell in a glass-encapsulated module. The use of layers comprising silicon carbide, amorphous silicon, silicon oxide, silicon oxynitride, or laminate systems comprising several of the above-mentioned layers or other dielectric layers is possible as well.

As explained above, in the method according to the invention a passivation is easily achieved of one silicon oxide layer each both regarding the p-doped as well as the n-doped sections at the front and the rear of the semiconductor substrate by the application at both sides. Preferably the method according to the invention is here embodied such that in the processing step B in addition to the generation of a selective emitter doping structure further a selective doping structure of a base doping type is embodied at the rear of the semiconductor substrate, in which at least a plurality of high-doped sections of the base doping type are generated at the rear, also called "local back surface field". These high doped sections of the back therefore comprise a higher doping concentration in reference to the base doping concentration, however having the same doping type. Furthermore it is advantageous to embody a low doped section of the base doping type at the back, which covers the back in a planar fashion and is doped higher than the base doping of the semiconductor substrate, however doped lower than the high doped sections. In this preferred embodiment the low doped section at the back of the semiconductor substrate comprises a plurality of higher doped sections of the base doping type.

A thermal oxide forms when the semiconductor substrate is subjected preferably to temperature above 650° C. and an oxidizing atmosphere. This atmosphere preferably comprises water vapor, oxygen gas, ozone, or a combination thereof. The addition of chlorinated chemicals is beneficial. The scope of the invention also includes the addition of other gases, such as nitrogen or other inert gases to dilute the gaseous atmosphere. Furthermore, the thermal oxide can be generated under increased pressure (exceeding 1 bar) in order to reduce the oxidation period required for the desired thickness; since the oxidation rate increases with higher pressures.

In the processing step B1 simultaneously one silicon oxide layer is generated on the front and the back of the semiconductor substrate via thermal oxidation. The speed of a silicon oxide layer developing in thermal oxidation, i.e. the growth rate, essentially depends on the condition of the surface and the surface doping concentration of the semiconductor substrate at the surface. In general, the growth rate is higher in textured surfaces than on planar areas, particularly in monocrystalline silicon-semiconductor substrates, having an arbitrary pyramid structure, with the areas of the pyramids having the crystal orientation (111). Additionally, the growth rate is higher in more concentrated surface doping than in lower concentrated surface doping.

In general, in common thermal oxidation processes of prior art the silicon oxide layer in processing step B1 develops on the front with a considerably larger growth rate than on the back of the semiconductor substrate.

Preferably the method according to the invention is embodied such that in the processing step B1 the silicon oxide layer is applied on the back with a thickness deviating by less than 10 nm, preferably less than 5 nm, particularly less than 2 nm from the thickness of the silicon layer on the front. This way it is ensured that when a minimum thickness of the silicon oxide layer is achieved on the back, beneficial for passivation, preferably from 5 nm to 30 nm, however no considerably thicker silicon oxide layer develops on the front and here, on the one hand, sufficient electric passivation is achieved on the back and on the other side a negligibly low interference of the optic features of the front, due to the low thickness of the frontal silicon—oxide layer.

In another advantageous embodiment the frontal oxide layer is generated with a thickness maximizing the light coupling in case no additional layers are applied. For this purpose the layer thicknesses range from 80 to 120 nm, in particular advantageously amounting to approx. 100 nm. In this case, the silicon layer of the rear silicon oxide layer ranges preferably from 10 nm to 120 nm, preferably from 20 nm to 105 nm, further preferred from 50 nm to 105 nm.

However, typically a solar cell is used such that several solar cells are encapsulated to form a module. Here it is advantageous that in a method according to the invention, in the processing step B1, the frontal silicon oxide layer is generated with a thickness of less than 30 nm. This way, on the one hand, sufficient electric passivation is yielded, on the other hand the optic features are not conclusively determined with regards to coupling electromagnetic radiation at the front of the semiconductor structure, due to the thickness of the frontal silicon oxide layer being less than 30 nm. In particular, a common silicon nitride layer can be applied on the silicon oxide layer such that, particularly for the typical use of the solar cell in a module, a diffraction index behavior develops, influencing the optic features only to a minor extent, based on the semiconductor substrate, which preferably is formed from silicon, via the silicon oxide layer, the silicon nitride layer, and finally the layers of the module facing the light.

As mentioned above, contrary to otherwise common unilateral coating processes, the thermal oxide grows from all surfaces of the semiconductor substrate into said semiconductor substrate. In addition to the electric passivation via the thermal oxide here an advantageous effect develops with regards to the selective emitter structure generated at the front in the processing step B.

Starting at the surface of the semiconductor substrate, the emitter structure has falling doping profiles, thus the doping concentration reduces, starting at the front of the semiconductor substrate, in the direction to the back of the semiconductor. Due to the temperatures used during the thermal oxidation the doping profile of the emitter changes by the surface concentration being lowered by the existing concentration gradient of the doping substance and the doping substance diffuses away from the surface into the interior of the semiconductor. Furthermore, due to the fact that the thermal oxide grows into the semiconductor substrate here a layer at the surface of the semiconductor substrate is converted into silicon oxide. This converted layer is therefore electrically inactive so that for the electric features of the solar cell and particularly the surface recombination features the boundary semiconductor substrate/silicon oxide is relevant. The concentration of surface doping relevant for the electric features is here reduced such that on the one hand, during the thermal oxidation, the surface concentration is lowered by the diffusion of the doping substance away from the boundary and additionally the thermal oxide grows into the semiconductor substrate and here a particularly low density develops at the interfaces.

The lower (electrically relevant) concentration of surface doping therefore leads to a reduction of the recombination loss, because particularly the auger-recombination increases with a rising concentration of doping. Due to the thermal oxidation even silicon-phosphorus precipitates (in case of phosphorus doping) near the surface can be dissolved, which are very actively recombining.

Advantageously the frontal oxide layer is generated in the processing step B1 such that the concentration of surface doping of the low-doped section at the front amounts to less than $4\times10^{20}$ cm$^{-3}$, preferably less than $2\times10^{20}$ cm$^{-3}$, particularly less than $1\times10^{20}$ cm$^{-3}$, further preferred less than $5\times10^{19}$ cm$^{-3}$ in order to reduce loss from recombination in the low-doped section.

In order to yield a sufficient reduction of the concentration of surface doping for typical emitter doping profiles in the low-doped section preferably in the processing step B1 a layer at the front of the semiconductor substrate with a thickness ranging from 2 nm to 100 nm, preferably from 2 nm to 10 nm is converted into silicon oxide.

As mentioned above, it is advantageous that the layer thickness of the silicon oxide layers generated in the processing step B1 deviate from each other with regards to the thickness only slightly or not a tall at the front and the back. Experiments of the applicant have shown that preferably in the processing step B1 the silicon oxide layers at the front and the back are generated for a first predetermined period with a first growth rate and for a subsequent second period with a second growth rate greater than the first one. This is caused, according to the acknowledgement of the applicant, in that for typical solar cells the faster growth of the silicon oxide layer at the front is largely caused by the higher concentration of surface doping given at the front due to the selective emitter structure generated at the front, as described in Massoud et al., Thermal Oxidation of Silicon in Dry Oxygen Growth-Rate Enhancement in the Thin Regime, in J. Electrochem. Soc.: SOLID-STATE SCHIENCE AND TECHNOLOGY, Vol. 132, No. 11, 1985, 2685-2700.

Furthermore, according to the knowledge of the applicant at low growth rates the difference in thickness of the generated silicon oxide layers at the front and the back is lower than in higher growth rates. Preferably, here first a growth of the silicon oxide layers occurs with a first, low growth rate immediately on the semiconductor substrate at the front and the back. As soon as the front is coated with a first, thin silicon oxide layer the growth rate can be increased, because now the concentration of surface doping at the front of the semiconductor substrate no longer causes any acceleration of growth or only to a minor extent.

In this preferred embodiment of the method according to the invention here a low difference in thickness is ensured by the first slow growth rate and by the second growth rate, higher than the first one, a process acceleration is yielded in order to obtain the desired overall thickness of the silicon oxide layers at the front and the back in a shorter processing period.

Preferably here the growth of the silicon oxide layers occurs with a first low growth rate until the silicon oxide layer generated at the front has a thickness of less than 5 nm, preferably less than 4 nm, preferably approximately 3 nm, and subsequently the application of the silicon oxide layers occurs with a growth rate exceeding the first growth rate.

Examinations of the applicant have shown that preferably in the processing step B1 the growth rate, when generating the silicon oxide layers at the front and the back, is influenced such that for a first predetermined period of time the thermal oxidation occurs in a gaseous atmosphere with less than 10% oxygen content and subsequently the portion of oxygen gas is increased. In particular the reduction of the portions of oxygen gas can be performed with little process expenses by supplying inert gas, preferably nitrogen. By the variation of the oxygen rate here in a simple fashion the growth rate can be varied and the processing step B1 can be optimized on the one hand with regards to generating silicon oxide layers at the front and the back with only slight differences in thickness and on the other hand with regards to an overall processing term being as short as possible. Additionally, other atmosphere compositions are included in the scope of the invention, for example with $H_2O$-vapor, particularly purified water vapor, generated from evaporated deionized water, and the addition of chlorinated compounds. Here, too, the addition of inert gas is advantageous in order to dilute the gaseous atmosphere.

Preferably the processing step B1 occurs with the following oxygen gas concentrations for the following periods: For the first period with a concentration of less than 10% oxygen gas rate for less than 60 minutes, preferably less than 30 minutes, preferably less than 10 minutes, and for the second period with a concentration exceeding 10% oxygen gas rate for less than 60 minutes, further preferred less than 10 minutes, preferably less than 5 minutes.

Both periods preferably amount to at least 1 minute, further preferred at least 3 minutes. The first oxygen portion is preferably greater than 1%, further preferred greater than 3%.

A particularly simple embodiment of the method according to the invention results from the combination with such processing steps in which in the processing step B, when generating the selective doping structure of the emitter doping type on the front as well as on the back, at least sectionally doping sections develop of the emitter doping type. Such doping methods can be realized in a particular cost-effective fashion, because no unilateral precipitation or no additional protection of the back is necessary by a layer applied in an additional processing step.

The scope of the invention also includes to apply a diffusion barrier layer on the back before applying the emitter doping so that no emitter diffusion occurs at the back.

Preferably one layer is removed between the processing step B and the processing step B1 on the back of the silicon semiconductor substrate, which has a doping of the emitter doping type or a diffusion barrier layer. In particular, it is advantageous that the removal occurs in a wet-chemical fashion known per se. Advantageously the diffusion barrier layer is removed entirely and/or a silicon layer is removed with a thickness of at least 0.1 µm, further preferred at least 0.5 µm, particularly at least 1 µm, further preferred ranging from 0.1 µm to 20 µm. Preferably the removal occurs over the entire surface at the back.

The method according to the invention is characterized further such that the silicon oxide layers used for passivation cause an electric passivation and on the other hand, due to the low thickness at the front, the optic features are not compromised disadvantageously with regards to the use of the solar cell in a module or the oxide layer can be used as an anti-reflex layer.

Preferably the silicon layers on the front and the back are therefore not removed in the processing steps following the processing step B1. Contrary to other methods, in which for example concentrations of the surface doping is yielded by growing a silicon oxide layer and removing this silicon oxide layer the method according to the invention represents a less complex process and therefore it is more cost effective.

Preferably, in the method according to the invention, prior to the processing step B1, preferably between the processing step A and the processing step B1, particularly preferred between the processing step B and the processing step B1, perhaps with additional intermediate steps being interposed, unevenness is leveled at the rear surface of the semiconductor substrate or at least reduced. This leads to the advantage that the passivation features of the silicon oxide layer at the back of the semiconductor substrate are additionally improved because the electric passivation is generally yielded with better quality on planar surfaces than on textured surfaces.

The leveling occurs preferably via wet-chemical methods using acidic or alkaline etching solutions or via plasma-supported processes, particularly advantageously without masking in a continuous processing device. Preferably the layer is removed via wet-chemical etching, particularly preferred via a mixture comprising hydrofluoric acid (HF), nitric acid ($HNO_3$), acetic acid ($CH_3COOH$), and water ($H_2O$). The removal occurs preferably via the following processing steps comprising: Silicon is etched by an etching solution or converted into a layer of porous silicon, which is then removed in a brief second etching step by potassium hydroxide (KOH) diluted in water. Preferably after an etching step, preferably after each etching step the surfaces are rinsed.

Furthermore, the leveling of the back can occur by hydrofluoric acid (HF) with tensides added, here, preferably using higher-concentrated hydrofluoric acid.

Furthermore, the leveling of the back can occur by phosphoric acid ($H_3PO_4$).

Furthermore the leveling of the back can occur by sulfuric acid ($H_2SO_4$) or $H_2SO_4$ diluted in $H_2O$.

Furthermore, the leveling of the back can occur by potassium hydroxide (KOH) or sodium hydroxide (NaOH) dissolved in $H_2O$.

Furthermore, the leveling of the back can occur by sodium hypochlorite (NaOCl) dissolved in $H_2O$.

In another preferred embodiment of the method according to the invention the leveling occurs via plasma-supported etching.

In another particularly advantageous embodiment, together with the leveling, a doped section is removed present on the rear surface comprising a doping type opposite the one of the substrate. This doped section develops when in the processing step B, due to processing, a doped section of the emitter doping type is generated both on the front as well as on the back of the semiconductor substrate.

Preferably, in the method according to the invention between the processing step B and the processing step B1, perhaps with additional intermediate steps interposed, a layer near the surface is removed on the front of the semiconductor substrate. This way the above-described advantage develops of a reduced surface concentration in the low-doping range of the emitter. The removal of the layer near the surface reduces the scope of the conversion of the doping sections on the front to be performed by the subsequent thermal oxidation, by which processing time can be saved. The thickness of this layer ranges preferably from 1 nm to 300 nm.

The controlled removal of this layer near the surface can occur via wet-chemical etching (alkaline and/or acidic solutions), wet-chemical oxidation (e.g., via solutions comprising ozone or hydrogen peroxide) and a subsequent wet-chemical removal of the oxide layer, for example in hydrofluoric acid or via plasma etching.

The removal of the layer close to the surface can occur via one or more successively performed wet-chemical cleaning steps, such as described in W. Kern, "Handbook of semiconductor wafer cleaning technology" (Noyes, Park Ridge, N.J., 1993).

Preferably the layer is removed via wet-chemical etching, particularly preferred by a mixture of hydrofluoric acid (HF), nitric acid ($HNO_3$), acetic acid ($CH_3COOH$), and water ($H_2O$). The removal occurs preferably in processing steps comprising: A layer of porous silicon is formed by an etching solution, which then is removed in a brief etching step by potassium hydroxide (KOH) diluted in water. Subsequently rinsing is performed in water ($H_2O$).

Furthermore, the removal of the layer close to the surface can occur by hydrofluoric acid (HF) with the addition of tensides, preferably using higher concentrated hydrofluoric acid.

Furthermore, the removal of the layer near the surface can occur by phosphoric acid ($H_3PO_4$).

Furthermore, the removal of the layer near the surface can occur via sulfuric acid ($H_2SO_4$) or $H_2SO_4$ diluted in $H_2O$.

Furthermore, the removal of the layer near the surface can occur by potassium hydrochloride (KOH) or sodium hydrochloride (NaOH) dissolved in $H_2O$.

Furthermore, the removal of the layer near the surface can occur by sodium hypochloride (NaOCl) dissolved in $H_2O$.

In another preferred embodiment of the method according to the invention the layer is removed via a plasma-supported etching process.

Furthermore, examinations of the applicant have shown that via the method according to the invention, in the following preferred embodiment, solar cells can be produced in a particular fashion with high efficiency levels and simultaneously in a cost-effective as well as industrially implemented fashion:

Preferably in the processing step B the selective emitter doping structure is comprehensively generated in the following processing steps:

In a processing step Ba a doped layer comprising a doping substance is applied on the front of the semiconductor substrate. Preferably this occurs via vapor precipitation, such as CVD, APCVD, PECVD, PVD, or by growing doped silicate glass from the gaseous atmosphere (e.g., phosphorus silicate glass (PSG) or boron silicate glass (BSG)), alternatively via printing pastes comprising doped (substances) or sputtering or spraying doping liquids (e.g., diluted phosphoric acid). Here, too, the application by cathode spraying is included in the scope of the invention.

In a processing step Bb a local heating occurs of a melting section of the doped layer and a melting section of the semiconductor substrate located underneath the doped layer such that in a local section briefly a melted mixture forms comprising at least the melting section, the doped layer, and the melting section of the semiconductor substrate, with in a liquid-liquid diffusion process doping substance diffuses out of the doped layer into the molten semiconductor substrate, so that after the molten mixture has set the high-doped section is created.

In a processing step Bc the generation of the planar low-doped section occurs, in which the semiconductor substrate is globally heated such that the doping substance diffuses out of the doped layer into the semiconductor substrate.

The doped layer is removed in a processing step Bd.

The above-mentioned processing steps Ba through Bd are here executed in the sequence Ba, Bb, Bc, Bd, or Ba, Bc, Bb, Bd, each if applicable with additional intermediate steps being interposed. In particular, preferably the processing steps Ba and Bc are performed simultaneously.

If in the processing step Bc, caused by processing technology, a section also develops on the back which has the same doping type as the emitter, it is preferably removed, here. Preferably this rear doped section is removed with a method as described above for leveling the back.

Preferably, subsequently a wet-chemical or plasma-based cleaning of the semiconductor substrate occurs.

Then, as described above, in the processing step B1 the silicon oxide layer is generated via thermal oxidation on the front and the back, with among other things, as described above, particularly at the front a layer of the semiconductor substrate near the surface is converted into an electrically inactive silicon oxide layer.

In this preferred embodiment, in a cost-effective manner that can be industrially implemented, a selective emitter doped - structure is yielded. On the one hand, by the doped layer, which in the processing step Bc creates the planar emitter section with low doping by a global heating of the semiconductor substrate, and in the processing step Bb a local heating creating the high-doped section or sections, a selective doping profile being prepared in a simple fashion, without here cost-intensive masking steps being necessary. This is particularly caused such that in the processing step Bc the thermal diffusion from the doped layer into the semiconductor substrate occurs considerably slower compared to the local liquid-liquid diffusion in the local sections temporarily molten in the processing step Bb. It is already ensured by the different diffusion mechanisms, that in the processing step Bc a doped section is generated with a lower doping compared to the doped sections generated in the processing step Bb.

If in the processing step Bc, due to processing technology, a doped section of the emitter doping type develops at the back of the semiconductor substrate preferably after the processing step Bc and prior to the processing step B1 a semiconductor layer is removed at the back of the semiconductor substrate such that the rear doped section of the emitter doping type is removed.

Preferably between the processing step Bd and B1, perhaps with additional intermediates steps being interposed, a layer near the surface is removed, preferably by a wet-chemical cleaning of the semiconductor substrate, which simultaneously removes metallic, organic, or other contaminants.

The lowering of the concentration of the doping substance at the surface of the substrate yielded in the subsequent processing step B1 and the conversion of a layer near the surface at the front of the semiconductor substrate into an electrically inactive silicon oxide layer is particularly beneficial in the preferred embodiment when the selective emitter structure is generated as explained above:

In the processing step Bc typically so-called "kink and tail" doping profiles develop, i.e. doping profiles having very high doping concentrations in a section near the surface, subsequently a strong reduction, and finally a more flat projection. This is known per se and described, for example in Bentzen, A. et al. High concentration in-diffusion of phosphorus in Si from a spray-on source, Journal of Applied Physics, 99 (2006) p. 064502-1-8. This applies for phosphorous diffusion from an unlimited source.

However, in the liquid-liquid diffusion in the processing step Bb a doping profile develops which is approximately equivalent to a Gauss doping profile, i.e. starting at the surface the doping concentration drops steadily, however considerably slower, in comparison to a kink and tail—profile.

If now in the processing step B1 a layer is converted at the surface of the doping side of the semiconductor substrate, this leads in the low-doped section to a considerable lowering of the surface concentration of the doping substance (typically from equal or exceeding $6 \times 10^{20}$ cm$^{-3}$ to equal or less than $2 \times 10^{20}$ cm$^{-3}$), because the high-doped section near the surface of the kink and tail—profile is converted entirely or partially into an electrically non-conductive layer. At the local high-doped section or sections generated in the processing step Bb, as mentioned above, at lease approximately a Gauss doping profile is given, i.e. the conversion of the layer in the processing step B1 only leads to a comparatively minor reduction of the concentration of surface doping.

If in addition to the above-described process, in one preferred embodiment additionally prior to the processing step B1 a layer is removed at the surface of the doping side of the semiconductor substrate this leads to another considerable reduction of the surface concentration of the doping substance in the low-doped section, as explained above. Additionally, at the local high-doped section or sections generated in the processing step B, as mentioned above, at least approximately a Gauss doping profile is given, i.e. the removal of the layer only leads to a comparatively minor reduction of the concentration of surface doping.

Ultimately, here in the low-doping sections the surface doping concentration is considerably lowered in the processing step B1 so that in these sections the recombination activity, is considerably reduced particularly due to auger-recombination and phosphorus precipitation and thus loss of efficiency is avoided, as described in Nguyen, V. et al., Analysis of Screen-Printed Silicon Solar Cell Emitters in Proceedings 24$^{th}$ EU PVSEC, Hamburg, 2009. However, in the high-doped sections no or only a negligibly low reduction of the concentration of surface doping occurs in the processing step B1 so that still a low contact resistance is ensured between the semiconductor substrate and the metallic contact structure, due to a high concentration of surface doping.

Thus, in this preferred embodiment several synergy effects occur and a selective emitter doping structure can be produced in an optimized manner, which on the one hand can be integrated cost-effectively into industrial production processes, particularly due to the reduction or avoidance of masking steps, and on the other hand due to the, although implemented in a simple process, yet still effective passivation of the surfaces at the front and the back a high overall degree of efficiency of the finished solar cell can be yielded by the silicon oxide layers.

In an advantageous embodiment of the method according to the invention the implementation of the processing steps Ba through Bd occurs without any masking steps interposed here, in order to save costs.

This further distinguishes the method according to the invention from methods of prior art for the production of selective emitter doping structures in which several expensive masking steps are necessary.

The local heating in the processing step Bb preferably occurs via a laser. Here, a method known per se for laser doping can be applied, such as described in Jäger, U., et al, Selective emitter by laser doping from phosphosilicate glass, in Proceedings of the 24$^{th}$ European Photovoltaic Solar Energy Conference 2009. Hamburg, Germany.

The doped layer applied in the processing step Ba preferably has a thickness from 10 nm to 1 µm, preferably from 10 nm to 500 nm, further preferred from 10 nm to 100 nm. This ensures that sufficient doping substance is provided for the subsequent doping processes.

Furthermore, it is advantageous for the doped layer to comprise doping substance in a concentration of at least 1 percent by weight, preferably at least 4 percent by weight, further preferred ranging from 6 to 10 percent by weight.

In the processing step Ba the doped layer is applied, preferably covering the entire doped side of the semiconductor substrate. This leads to simpler processing.

In the processing step Bb preferably a local heating of the semiconductor substrate occurs to at least 1410° C. in order to ensure local melting and the above-stated liquid-liquid diffusion.

In order to simplify the process and reduce costs preferably in the processing steps Bb and Bc the doped sections are produced such that the low-doped section is applied entirely covering the front of the semiconductor substrate and a plurality of high-doped sections is formed. In particular the formation of the low-doped section entirely covering the front can be performed by simple processing technology, particularly such that in the processing step Ba the doped layer is applied entirely covering the front of the semiconductor substrate.

In the processing step B preferably high-doped and low-doped sections are embodied parallel in reference to the front of the semiconductor substrate, i.e. the doping concentration parallel in reference to the front remains essentially unchanged and the falling emitter doping profile is formed perpendicular in reference to the front, starting from said front, falling towards the back. Additionally the silicon oxide layers at the front and the back of the semiconductor substrate are embodied preferably parallel in reference to the surface.

The method according to the invention is particularly suitable for producing solar cells essentially formed from a silicon semiconductor substrate. In particular, the use of monocrystalline or multi-crystalline silicon wafers is advantageous for the semiconductor substrate, here.

At the front of a solar cell typically metallic contact structures are formed with linear elements, preferably comb-like or double comb-like metallic structures. This way, on the one hand a low mean distance can be ensured between any arbitrary point at the front of the semiconductor substrate and the nearest metallic structure and on the other hand the area covered by the metallic structure is minimized so that optic loss developing here is minimized as well.

Accordingly, in the processing step B the generation of the high-doped sections embodied to be covered with a metallic contact structure occurs preferably linearly, particularly preferred in a comb-like or double comb-like fashion.

In the processing step B the doped sections are preferably generated such that the low-doped section entirely covers the front of the semiconductor substrate and a plurality of high-doped sections is formed within the low-doped section. Due to the fact that the low-doped section is embodied entirely covering the front another simplification of the process is achieved.

The above-mentioned silicon oxide layers are advantageously embodied as layers of silicon dioxide (SiO$_2$).

BRIEF DESCRIPTION OF THE DRAWINGS

Additional features and preferred embodiments of the invention are discernible from the figures and the description of said figures. Here shown are:

FIG. 1 an exemplary embodiment of the method according to the invention, in which a high-doped section is generated via a local melting using a laser.

FIGS. 1a through d each represent details from a silicon wafer produced form the embodied semiconductor substrate 1. The semiconductor substrate 1 is p-doped with a doping concentration of approximately 10$^{16}$ cm$^{-3}$, having a thickness of 200 μm and is approximately embodied square, having an edge with a length of 15.6 cm.

DETAILED DESCRIPTION OF THE PREFERRED EMBODIMENTS

Identical reference characters in the FIGS. 1a through 1d mark identical elements. Furthermore, the front of the semiconductor substrate respectively to be formed for light coupling is shown located on top in FIGS. 1a through 1d.

In a processing step A the texturing of the semiconductor substrate 1 occurs. The semiconductor substrate 1 is embodied as a mono-crystalline silicon wafer and in order to create texture it is treated with a wet-chemical solution (comprising potassium hydroxide (KOH), isopropanol ($C_3H_8O$), and water ($H_2O$) such that on the one hand potentially present sawing damages resulting from the production of the wafer are removed and furthermore at the front and the back, due to the different etching speeds and depending on the orientation of the crystals, a pyramid-like texture develops (so-called "random pyramids"). The texturing process is therefore performed in a batch process.

The texturing leads to an increased light coupling at the front, however this texturing shows lower abilities for electric passivation in comparison to a planar surface. Accordingly, subsequently at the back the texture is removed by a unilateral wet-chemical treatment. Preferably the texture is leveled by wet-chemical etching, particularly preferred by the use of a mixture of hydrofluoric acid (HF), nitric acid ($HNO_3$), acetic acid ($CH_3COOH$), and water ($H_2O$). The removal occurs in the following processing steps comprising: An etching solution etches a layer of silicon or is converted into porous silicon, which is then removed in a brief second etching step by potassium hydroxide (KOH) diluted in water. This occurs preferably with a facility ensuring that only the back of the substrate is contacted by the etching solution. The back etching may also be performed in alkaline solutions or via plasma etching.

Subsequently, in a processing step B, a selective emitter doping structure is embodied at the front of the semiconductor substrate. The emitter doping structure is embodied n-doped.

Here, in a processing step Ba the application of a doped layer occurs on the front of the semiconductor substrate 1, located on top, which in the solar cell to be produced will be embodied for light coupling.

The doped layer 2 is precipitated via chemical vapor deposition (CVD) and comprises SiOx:P (phosphorus silicate glass "PSG") with the doping substance phosphorus at a concentration from 4 to 8 percent by weight. However, the layer may also be applied via physical vapor phase precipitation (PVD) or via cathode sputtering.

Other methods of application, such as sputtering, spraying, or printing may also be used.

In a processing step Bb, via local heating by a laser beam, in local sections H briefly a melted mixture is generated from the doped layer and the semiconductor substrate 1. Inside the melted mixture a liquid-liquid diffusion of the doping substance occurs from the doped layer into the semiconductor substrate 1, so that after the molten layer has set a high-doped section 3 is present in the semiconductor substrate having at the surface of the semiconductor substrate 1 a doping concentration of approx. $4 \times 10^{20}$ cm$^{-3}$.

The laser doping process is performed with pulsed lasers, which have a wavelength ranging from 190 nm to 1100 nm. The pulse lengths may range from 1 ps to 5 μs, depending on the repetition rate selected. Preferably a laser is selected with a wavelength of 343, 355, 515, or 532 nm at pulse lengths ranging from 10-500 ns. It is also possible to perform the doping process with a laser in permanent operation ("cw"=continuous wave) or a cw-laser in a modulated operation with the above-mentioned wavelengths.

In a processing step Bc a global heating of the semiconductor substrate 1 occurs in a continuous kiln to a temperature of 850° C. for a period of 30 minutes. This way, diffusion is achieved of doping substance from the doped layer into the semiconductor substrate 1 at the front of the semiconductor substrate such that a low-doped section 4 forms. Due to this process the low-doped section has a kink and tail—profile, as described for example in Bentzen, A. et al. High concentration in—diffusion of phosphorus in Si from a spray-on source, Journal of Applied Physics, 99 (2006) p. 064502-108, having a concentration of surface doping of $5 \times 10^{20}$ cm$^{-3}$ and a layer resistance of 50 Ohm/sq.

Alternatively, in a processing step Bc a global heating of the semiconductor substrate 1 occurs in a continuous kiln at a temperature of 800° C. for a period of 40 minutes. This way diffusion occurs of doping substance from the doped layer into the semiconductor substrate 1 at the front of the semiconductor substrate so that a low-doped section 4 forms. Due to this process the low-doped section has a kink and tail—profile, such as described in C. Betram, et al. Emitter profile tailoring by gas flux variation in tube furnace $POCl_3$-diffusion and analysis of the phosphosilicate glass, In 24$^{th}$ European Photovoltaic Solar Energy Conference, 2009, Hamburg, Germany, having a surface doping concentration of $7 \times 10^{20}$ cm$^{-3}$ and a layer resistance of 120 Ohm/sq.

The layer resistance of the high-doped section 3 generated in the processing step Bb is 20 Ohm/sq, though.

In the above-mentioned diffusion process, caused by processing technology, a doped section of the emitter doping type is also generated at the back of the semiconductor substrate. Accordingly a layer with a thickness of approx. 1 μm is subsequently removed at the back.

In a processing step Bd the doped layer is removed by the following wet-chemical process: By way of etching the front for less than 2 min. in 10% conc. hydrofluoric acid (HF) in $H_2O$ and a subsequent rinsing with $H_2O$.

Subsequently a cleaning process occurs of the semiconductor substrate 1 in a wet-chemical cleaning sequence. The cleaning sequence comprises cleaning in a heated solution of ammonium hydroxide ($NH_4OH$), hydrogen peroxide ($H_2O_2$) and $H_2O$, followed (by) a cleaning lasting less than 2 minutes in 1% HF, then in a heated mixture of hydrochloric acid (HCl), $H_2O_2$, and $H_2O$, once more followed by a cleaning lasting less than 2 minutes in 1% conc. HF. This cleaning sequence is also called SC1/SC2. Here, silicon near the surface and other atoms are chemically oxidized and subsequently removed in a hydrofluoric acid solution. Here, the resistance of the emitter in the emitter layer already increases in the low-doped section 4, while the resistance of the emitter layer in the higher doped section 3 hardly changes due to the Gauss doping profile given here.

In a processing step C, subsequently via thermal oxidation in an oxygen-rich atmosphere a thermal oxide is generated with a thickness of approx. 15 nm simultaneously on the front and the back of the semiconductor substrate. This occurs in a continuous kiln or a tubular oven. Using the thermal oxide the surfaces of the semiconductor 1 are passivated. Due to the global heating of the semiconductor substrate to approx. 850° C. for approximately one hour additionally the planar emitter improves in the low-doped section 4 because by the thermal budget during the thermal oxidation the surface concentration of the doping substance drops, the emitter is driven in, and thus the auger-recombination is reduced and precipitations are dissolved.

The result with the silicon oxide layer 5a at the front and the silicon oxide layer 5b at the back is shown in FIG. 1b. Subsequently at the front a silicon nitride layer 5c with a thickness of approx. 70 nm is applied in order to improve the optic features with regards to coupling electromagnetic radiation impinging the front 2. This may occur with CVD-methods (PECVD, APVCD, LPCVD), but also by cathode sputtering or other PVD-methods. The use of other layers or layer systems, such as silicon oxide, silicon oxinitride, silicon carbide, aluminum oxide, amorphous silicon, as well as other dielectric layers or layer systems is also possible, here.

The result is shown in FIG. 1c.

Subsequently, additionally on the back another dielectric layer 5d is precipitated on the silicon oxide layer 5b. The precipitation occurs via plasma-supported vapor phase precipitation. This additional dielectric layer is embodied as a silicon oxide layer (with here the ratio of silicon to oxygen deviates from the thermal silicon oxide) and causes that, in combination with the back contact metal applied on this layer, a better dielectric mirror forms and that without the local contacting no electric contact develops between the silicon substrate and the metal. Additionally, the embodiment of this layer is possible as a silicon nitride layer, aluminum oxide, silicon carbide, amorphous silicon, silicon oxinitride, and other dielectric layers or layer systems.

Subsequently, in a processing step C, an application of a comb-like embodied metallic emitter contact structure 6 occurs on the front 2 of the semiconductor substrate as well as a metallic base contact structure 7 on the back of the semiconductor substrate. The contact structure on the back of the semiconductor substrate is formed via local melting by a laser, as described in E. Schneiderlochner et al. Laser-fired rear contacts for crystalline silicon solar cells. Progress in Photovoltaics: Research and Applications 10 (2002) 29-34. This way, in a simple fashion a large-area passivation and local contacting of the base of the semiconductor substrate is possible by the rear local contacting points.

Preferably the structure is then subjected to a tempering step between 200° C. and 600° C., because this improves the surface passivation of the oxide layer.

This tempering layer preferably occurs in an inert atmosphere, for example nitrogen or argon gas, or in a reducing atmosphere, for example a mixture of nitrogen and hydrogen gas.

The result is shown in FIG. 1d.

The invention claimed is:

1. A method for the production of a photovoltaic solar cell comprising the following processing steps:
    A texturing a front (2) of a silicon semiconductor substrate (1), which is doped with a base doping type,
    B generating at least one selective doping structure at the front (2) of the semiconductor substrate (1) by at least generating a planar low-doped section (4) at the front (2) having a first doping profile in the semiconductor substrate (1), and within the low-doped section having the first doping profile generating at least one local high-doped section (3) of a second doping profile, with the low-doped section (4) and the high-doped section (3) each being embodied with an emitter doping type opposite the base doping type, and the high-doped section (3) being embodied with a lower lateral conductive resistance than the low-doped section, and
    C applying at least one metallic emitter contact structure on at least one of the front (2) of the semiconductor substrate or additional intermediate layers, at least partially at the sections of local high-doping, with the emitter contact structure being connected to the high-doped section (3) in an electrically conductive fashion, and applying at least one metallic base contact structure on at least one of a back of the semiconductor substrate or additional intermediate layers, with the base contact structure being connected to a section of the semiconductor substrate of the base doping type in an electrically conductive fashion,
between the processing steps B and C, in a processing step B1 simultaneously one silicon oxide layer (5a, 5b) each is respectively generated on the front and the back of the semiconductor substrate via thermal oxidation, with at least a frontal silicon oxide layer being created with a thickness of less than 150 nm,
    wherein the silicon oxide lavers (5a, 5b) are generated after generation of the selective doping structure at the front of the semiconductor substrate.

2. A method according to claim 1, wherein in the processing step B1 the silicon oxide layer (5b) is applied on the back with a layer deviating by less than 10 nm from the thickness of the silicon layer on the front (2).

3. A method according to claim 1, in which in the processing step B1 the frontal oxide layer (5a) is generated such that a concentration of surface doping of the low-doped section at the front (2) amounts to less than 4 ×1020 cm-3.

4. A method according to claim 1, wherein in the processing step B1 a layer with a thickness from 2 nm to 100 nm is converted into silicon oxide at the front (2) of the semiconductor substrate.

5. A method according to claim 1, wherein in the processing step B1 the silicon oxide layers at the front and the back are generated for a first predetermined period with a first growth rate and for a second predetermined period with a second growth rate greater than the first one.

6. A method according to claim 1, wherein in the processing step B1 for a first predetermined period the thermal oxidation occurs in a gaseous atmosphere with less than 10% oxygen content and subsequently an oxygen rate is increased.

7. A method according to claim 1, wherein the silicon oxide layers on the front and the back are not removed in the processing steps following the processing step B1.

8. A method according to claim 1, wherein prior to the processing step B1, uneven structures at the back of the semiconductor substrate are leveled or at least reduced.

9. A method according to claim 1, wherein between the processing step B and the processing step B1 a layer near the surface is removed at least on the front of the substrate.

10. A method according to claim 1, wherein in the processing step B the elective emitter structure is created comprising the following processing steps:
    Ba applying a doped layer comprising a doping substance on the front (2) of the semiconductor substrate,
    Bb locally heating a melting section of the doped layer and a melting section of the semiconductor substrate located underneath the doped layer such that in a local area briefly a molten mixture forms comprising at least the molten section of the doped layer and the molten section of the semiconductor substrate, with via liquid-liquid diffusion doping substance from the doped layer diffuses into the molten semiconductor substrate (1) so that after the molten mixture has set the high-doped section is generated,
    Bc generating a planar low-doped section by globally heating the semiconductor substrate (1) such that the doping substance diffuses from the doped layer into the semiconductor substrate (1), and Bd removing the doped layer, with the processing steps performed in a sequence Ba, Bb, Bc, Bd or Ba, Bc, Bb, Bd.

11. A method according to claim 10, wherein the processing steps Ba to Bd are performed without any masking steps being performed between them.

12. A method according to claim 10, wherein the doped layer has a thickness from 10 nm to 1 μm.

13. A method according to claim 10, wherein the doped layer (2) is applied comprising doping substance in a concentration of at least 1 percent by weight.

14. A method according to claim 10, wherein in the processing step Ba the doped layer is applied covering the entire front (2) of the semiconductor substrate.

15. A method according to claim 10, wherein in the processing step B the local melting occurs via local heating by a laser.

16. A method according to claim 10, wherein in the processing step B heating occurs to at least 1410° C. for the local melting of the semiconductor substrate.

17. A method according to claim 10, wherein the processing steps Ba and Bc are performed simultaneously in a single processing step.

* * * * *